United States Patent
Brox

(10) Patent No.: US 7,317,656 B2
(45) Date of Patent: Jan. 8, 2008

(54) SEMI-CONDUCTOR MEMORY COMPONENT, AND A PROCESS FOR OPERATING A SEMI-CONDUCTOR MEMORY COMPONENT

(75) Inventor: Martin Brox, München (DE)

(73) Assignee: Infineon Technologies AG, Munich (DE)

( * ) Notice: Subject to any disclaimer, the term of this patent is extended or adjusted under 35 U.S.C. 154(b) by 613 days.

(21) Appl. No.: 10/892,546

(22) Filed: Jul. 16, 2004

(65) Prior Publication Data

US 2005/0052913 A1 Mar. 10, 2005

(30) Foreign Application Priority Data

Jul. 18, 2003 (DE) ................................ 103 33 280

(51) Int. Cl.
*G11C 8/00* (2006.01)
(52) U.S. Cl. ............. 365/233; 365/189.01; 365/189.04
(58) Field of Classification Search ................ 365/233, 365/189.01, 189.04
See application file for complete search history.

(56) References Cited

U.S. PATENT DOCUMENTS

| | | | |
|---|---|---|---|
| 5,813,041 A * | 9/1998 | McIntyre et al. ........... 365/233 |
| 5,848,025 A | 12/1998 | Marietta et al. | |
| 5,881,017 A * | 3/1999 | Matsumoto et al. ... 365/230.04 |
| 5,918,030 A * | 6/1999 | Christian et al. ........... 712/206 |
| 2002/0141272 A1* | 10/2002 | Benedix et al. ............. 365/222 |
| 2003/0084234 A1 | 5/2003 | Hang | |

* cited by examiner

*Primary Examiner*—Thong Q. Le
(74) *Attorney, Agent, or Firm*—Slater & Matsil, L.L.P.

(57) ABSTRACT

The invention relates to a semi-conductor memory component and process for operating a semi-conductor memory component, including activating the memory cells of a memory cell array, when one or several memory cell(s) included in the first set of memory cells need(s) to be accessed, accessing the corresponding memory cell or memory cells, deactivating the memory cells contained in a first set of memory cells, when one or several further memory cells that are not included in the first set of memory cells need(s) to be accessed, and prematurely deactivating the memory cells included in the first set of memory cells, when a predetermined time period or number of pulses after one or several memory cells included in the first set of memory cells have last been accessed first no further accessing of one or several of the memory cells included in the first set of memory cells takes place.

20 Claims, 2 Drawing Sheets

SEMI-CONDUCTOR MEMORY COMPONENT, AND A PROCESS FOR OPERATING A SEMI-CONDUCTOR MEMORY COMPONENT

CLAIM FOR PRIORITY

This application claims the benefit of German Application DE 103 33 280.4, which was filed in the German language on Jul. 18, 2003, the contents of which are hereby incorporated by reference.

TECHNICAL FIELD OF THE INVENTION

The invention refers to a process for operating a semi-conductor memory component, and to a semi-conductor memory component.

BACKGROUND OF THE INVENTION

In semi-conductor memory components a distinction is made between so-called function memory components (e.g. PLAs, PALs, etc.), and so-called table memory components, e.g. ROM-components (ROM=Read Only Memory and/or non-volatile memory), and RAM-components (RAM=Random Access Memory and/or write/read memory).

A RAM component is a memory device, in which data is stored after an address has been specified, which data can later be read out again under that address.

The corresponding address can be entered into the RAM component via so-called address connections or address input pins. Several, e.g. 16 so-called data connections and/or data-input/output pins (I/Os) are provided for inputting or outputting data. By applying a corresponding signal (e.g. a read/write signal) to a write/read selection connection and/or pin, it can be (instantly) determined whether data is to be stored or read out.

Because as many memory cells as possible must be accommodated in a RAM component, it is important for the former to be created as simply as possible. In so-called SRAMs (SRAM=Static Random Access Memory) the individual memory cells consist of only a few, e.g. six transistors, and in so-called DRAMs (DRAM=Dynamic Random Access Memory) usually consist of a single appropriately controlled capacitor, the capacitance of which can be used to store one bit as a charge. This charge however persists only for a short time; for this reason it needs to "refreshed" regularly, e.g. ca. every 64 ms.

For technological reasons in memory, in particular, DRAM components the individual memory cells are arranged in a multitude of adjacent rows and columns in a rectangular matrix and/or a rectangular array.

In order to achieve a correspondingly high total storage capacity and/or to achieve the highest data reading and/or writing speed,—instead of a single array—several, for instance four—essentially rectangular—(sub-) arrays (so-called "memory banks") can be arranged in a single RAM component and/or chip ("multi-bank chip").

In order to perform a writing or reading operation, a specific, unchanging sequence of commands must be issued:

First for instance a corresponding word line specifically allocated to a particular sub-array ("memory bank") (and defined by the "row address") is activated by means of a word line activation command (activate command (ACT)). This allows the corresponding data—exactly specified by the corresponding column address—to be correspondingly output (or read in)—with the help of a corresponding read/write (RD=read, or WT=write) command.

Next the corresponding word line is deactivated again—with the help of a word line deactivation command (e.g. a pre-charge command (PRE command)), and the corresponding sub-array ("memory bank") prepared for the next word line activation command (ACT=activate command).

In order to guarantee a fault-free operation of the DRAM component, specific chronological conditions must be maintained.

For instance, a particular delay tRCD (the so-called RAS-CAS delay) must occur between the word line activation command (ACT command) and a corresponding read (or write) command (RD (or WT) command). The RAS-CAS delay for instance is a result of the time needed by the sense amplifier to amplify the data delivered by the memory cells addressed by the word line.

Correspondingly a time interval tRP (the so-called "row pre-charge time" delay) must also be maintained between the read (or write) command (RD (or WT) command) and a subsequent word line deactivation command (PRE-command).

Due to the provision of several mutually independent sub-arrays ("memory banks")—as described above—in a single DRAM component—for which mutually independent corresponding word line activation and deactivation commands are in each case generated by a corresponding memory component control device ("memory controller")—the delay times—occurring in total for the component during the writing and/or reading of data (for instance because parallel and/or chronologically overlapping corresponding write or read accesses can be performed at several separate sub-arrays ("memory banks"))—can be reduced and the capability of the DRAM component correspondingly increased.

In order to increase the capability of a corresponding DRAM component even more, the relevant word line can at first be left in an activated condition (i.e. the corresponding word line deactivation command (PRE command) can initially be suppressed by the corresponding memory component control device ("memory controller")—after having output a corresponding word line activation command (ACT command), and a corresponding read (or write) command (RD (or WT) command)).

If—which is statistically relatively common—a memory cell or cells is/are next accessed in the corresponding sub-array ("memory bank") allocated to the same word line and/or row as that/those memory cell(s) that was/were accessed immediately before, the outputting of a further word line activation command (ACT-command) can be dispensed with.

Instead the memory component control device ("memory controller") can immediately output a corresponding read (or write) command (RD (or WT) command) to the sub-array ("memory bank") in question (and thereby it can be achieved that the corresponding data can be immediately read out (or input)—without a corresponding RAS-CAS delay (tRCD) taking place).

Only then—which is statistically much less common—when a memory cell or cells in a corresponding sub-array ("memory bank") allocated to a different word line or row to that/those memory cell(s) which was/were accessed immediately before, is/are accessed, is the corresponding word line—last used—deactivated by issuing a corresponding word line deactivation command (PRE command), and the—new—word line activated (by issuing a corresponding further word line activation command (ACT command)).

SUMMARY OF THE INVENTION

The invention is directed to a process for operating a semi-conductor memory component and semi-conductor memory component.

According to one embodiment of the invention, there is a process for operating a semi-conductor memory component, including:

Activating memory cells—included in a first set of memory cells—of a memory cell array, particularly memory cells lying in the same row or column of the memory cell array, when one or several memory cell(s) included in the first set of memory cells need(s) to be accessed;

Accessing the corresponding memory cell or memory cells;

Deactivating the memory cells included in the first set of memory cells, when one or several further memory cells that are not included in the first set of memory cells need to be accessed; and Prematurely deactivating the memory cells included in the first set of memory cells, when a predetermined time period or number of pulses ($tCOUNT_{max}$) after one or several memory cells included in the first set of memory cells have last been accessed no further accessing of one or several of the memory cells included in the first set of memory cells takes place.

Advantageously, the semi-conductor memory component contains several memory cell arrays ("memory banks"), and the premature deactivation of the relevant memory cell array is decentrally controlled for each memory cell array by a decentralized control device allocated to it, and provided on the semi-conductor memory component.

BRIEF DESCRIPTION OF THE DRAWINGS

The invention is described in more detail by use of exemplary embodiments and the accompanying drawings. In the drawings.

DETAILED DESCRIPTION OF THE INVENTION

Figure 1:
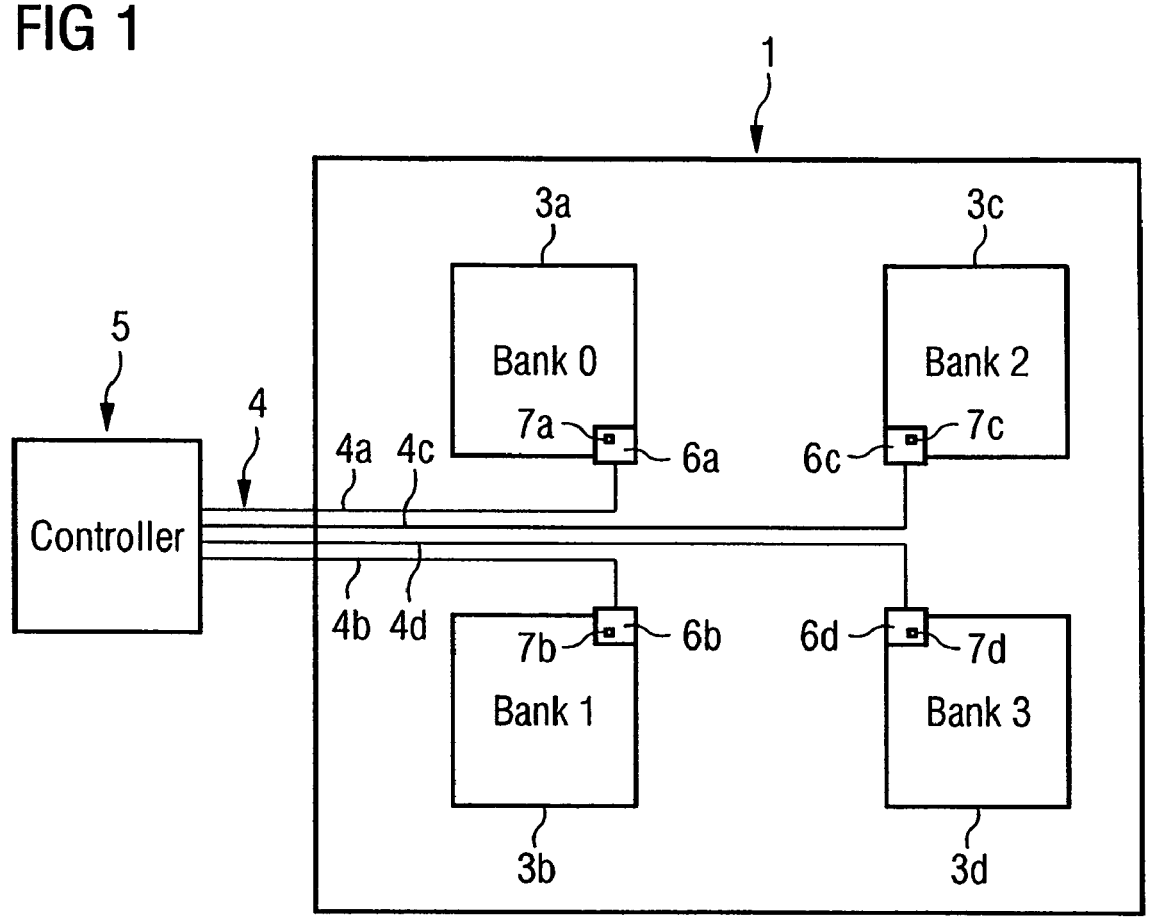
FIG. 1 shows construction of a semi-conductor memory component with several sub-arrays, and a memory component control device in accordance with an embodiment example of the present invention.

FIG. 1 shows a representation of the construction of a semi-conductor memory component 1 and/or semi-conductor memory chip, and a central memory component control device 5 in terms of an embodiment example of the present invention.

The semi-conductor memory component 1 can, for instance, be a table memory component—based on CMOS technology—e.g. a RAM memory component (RAM=Random Access Memory and/or write/read memory), particularly a DRAM memory component (DRAM=Dynamic Random Access Memory and/or dynamic write/read memory) (e.g. a DDR-DRAM (DDR-DRAM=Double Data Rate—DRAM and/or DRAM with double data rate)).

In the semi-conductor memory component 1—after a corresponding address has been input—data can be stored under that particular address and later read out again under that address.

The address can be input in several, e.g. two successive steps (e.g. first a row address—and possibly also parts of a column address—followed by the column-address (and/or the remaining parts of the column address, etc.).

By applying a corresponding control signal (e.g. a read/write signal) it can in each case be selected whether data is to be stored or read out.

The data input into the semi-conductor memory component 1 is stored there in corresponding memory cells, and later read out again from the corresponding memory cells.

Each memory cell for instance includes a few elements, particularly of just a single appropriately controlled condenser, of which the capacitance can be used to store one bit at a time in the form of a charge.

As is apparent from FIG. 1, a particular number of memory cells—lying in several adjacent rows and columns—are arranged in a rectangular and/or square sub array ("memory bank") 3a, 3b, 3c, 3d, in such a way that for instance 32 MBits, 64 MBits, 128 MBits, 256 MBits, etc. can in each case be stored in a sub array 3a, 3b, 3c, 3d, in accordance with the number of memory cells it includes.

As further shown in FIG. 1, the semi-conductor memory component 1 includes several, e.g. four essentially identically constructed memory cell sub arrays 3a, 3b, 3c, 3d (here: the memory banks 0-3)—essentially controlled independently of each other by the above memory component control device 5 and evenly distributed over the surface of the component—so that a total storage capacity of for instance 128 MBits, 256 MBits, 512 MBits, and/or 1024 MBits (or 1 GBit) is made available for the semi-conductor memory component 1.

The above address (input into the semi-conductor memory component 1 and/or the memory component control device 5) contains a corresponding number (here for instance two) bits ("sub array selection bits"), that serve to address the required sub-array 3a, 3b, 3c, 3d during the input and/or reading out of data in each case.

By providing several essentially independent sub-arrays 3a, 3b, 3c, 3d, it can be achieved that corresponding write or read actions can be performed—in parallel and/or chronologically overlapping—at several different sub-arrays 3a, 3b, 3c, 3d.

The central memory component control device 5 ("memory controller") can—as shown in FIG. 1 as an example—be constructed as a separate semi-conductor component, which communicates with the DRAM semi-conductor memory component 1 via external pins.

Alternatively the memory component control device 5 can also for instance be arranged on one and the same chip 1 as the above memory cell sub-arrays 3a, 3b, 3c, 3d (memory banks 0-3).

In order to perform a writing or reading action, a specific, unchanging sequence of commands is followed in the embodiment example shown here:

A corresponding word line and/or row of memory cells—allocated to the sub-array 3a, 3b, 3c, 3d laid down by the above address (particularly the above "sub-array selection bits") and defined by the relevant address ("row address"), is in fact first activated with the aid of a word line activation command (activate command (ACT)).

For this, a corresponding word line activation command signal (ACT command signal) is output by the memory component control device 5 via a corresponding (sub array control) line 4a, 4b, 4c, 4d of a control line data bus 4—allocated to the corresponding sub-array 3a, 3b, 3c, 3d.

Thereupon (correspondingly similar to conventional DRAM memory components) the sub-array control device 6a, 6b, 6c, 6d—separately provided for each sub-array 3a, 3b, 3c, 3d—which receives the ACT command signal in each case, causes the stored data values v—stored in the memory cells—allocated to every row defined by the row address in question—to be read out by the "sense amplifier" allocated to the corresponding word line.

Next—after receiving a corresponding read or write command signal (Read (RD) and/or Write (WT) command signal) sent to the relevant sub-array control device 6a, 6b, 6c, 6d, by the memory component control device 5 (after a particular time interval and/or number of pulses to be observed (the RAS-CAS delay time tRCD))—the corresponding sub-array control device 6a, 6b, 6c, 6d causes the corresponding data—then accurately specified (e.g. by the corresponding sense amplifier(s))—to be correspondingly output at the corresponding column address (or to be correspondingly read into the corresponding memory cell(s)).

The memory component control device 5 then leaves (correspondingly similar to conventional DRAM memory components) the relevant word line of the corresponding sub-array 3a, 3b, 3c, 3d—activated by the above ACT command signal—in the above activated state at first (i.e. it initially does not send a corresponding word line deactivation command signal (pre-charge and/or PRE command signal) to the corresponding sub-array 3a, 3b, 3c, 3d (see below)).

As shown in FIG. 1, each of the above sub-array control devices 6a, 6b, 6c, 6d has a corresponding timer and/or counter device 7a, 7b, 7c, 7d.

These are—as described below in more detail below with relation to FIG. 2—reset as soon as the relevant sub-array control device 6a, 6b, 6c, 6d has received the above read or write command signal (Read (RD) and/or Write (WT) command signal) from the memory component control device 5.

If no further read or write command signal (Read (RD) and/or write (WT) command signal) is received after a predetermined time interval and/or number of pulses by the relevant sub-array control device 6a, 6b, 6c, 6d of the memory component control device 5—as is also more closely described below—the timer and/or counter device 7a, 7b, 7c, 7d outputs a control signal (auto pre-charge or APRE signal).

This causes the sub-array control device 6a, 6b, 6c, 6d—although no corresponding word line deactivation command signal (pre-charge or PRE command signal) has been output yet by the memory component control device 5 to the corresponding sub-array control device 6a, 6b, 6c, 6d—to reactivate the above word line and to prepare the corresponding sub-array 3a, 3b, 3c, 3d for the next word line activation command (activate command (ACT)).

If—which is statistically frequently the case—even before the time interval or number of pulses—measured by the timer and/or counter device 7a, 7b, 7c, 7d has elapsed (i.e. even before the timer and/or counter device 7a, 7b, 7c, 7d outputs the above control signal (Auto Precharge or APRE signal))—and if a memory cell or cells at the corresponding sub-array 3a, 3b, 3c, 3d, allocated to the same word line and/or row as that/those memory cell or cells where the last accessing took place, is to be addressed—the memory component control device 5 immediately outputs— without a corresponding PRE or ACT signal being output—a corresponding read (or write) command (RD (or WT) command) to the sub-array control device 6a, 6b, 6c, 6d of the corresponding sub-array 3a, 3b, 3c, 3d.

This has the effect that the corresponding sub-array control device 6a, 6b, 6c, 6d causes the data (e.g. from the corresponding sense amplifier(s))—accurately specified by the corresponding column address—to be output immediately (or read into the corresponding memory cell(s), without a corresponding RAS-CAS delay tRCD taking place.

When however—which is statistically more rarely the case—at the corresponding sub-array 3a, 3b, 3c, 3d—instead of accessing the above memory cell(s)—a memory cell or cells, allocated to another word line and/or row as that/those memory cell(s) at which the last accessing took place—is/are accessed next, the memory component control device 5 sends a corresponding word line deactivation command signal (pre-charge or PRE command signal) to the corresponding sub-array 3a, 3b, 3c, 3d (and/or its sub-array control device 6a, 6b, 6c, 6d).

This causes the sub-array control device 6a, 6b, 6c, 6d to again deactivate the above word line, and to prepare the corresponding sub-array 3a, 3b, 3c, 3d for the next word line activation command (activate command (ACT)) related to another word line and/or row.

Below, the operating method of some (here: four) sub-array control devices 6a, 6b, 6c, 6d of some (here: four) memory cell sub-arrays 3a, 3b, 3c, 3d of the semi-conductor memory component 1 is described in detail—with the aid of a section of the (first) sub-array control device 6a of the (first) memory cell sub-array 3a shown as an example in FIG. 2.

As is apparent from FIG. 2 and more closely described below, the timer and/or counter device 7a of the sub-array control device 6a is connected to a register 10 via a line 13.

The resetting connection of the timer and/or counter device 7a is—as is also more closely described below— connected to a read/write command detection device 9 (RD/WT detection device 9) via a line 11, and the counter connection of the timer and/or counter device 7a is connected via a line 14d to a pulse line 14e, which supplies the central system pulse (pulse signal CLK) to the semi-conductor memory component 1.

The read/write command detection-device 9 (more accurately: its pulse input) is connected—via a line 14c—to the pulse line 14e, and to a line 14b, via which a read or write command signal (read (RD) and/or write (WT) command signal) output by the memory component control device 5 for the relevant memory cell sub-array 3a, is relayed to the read/write command detection device 9.

Figure 2:
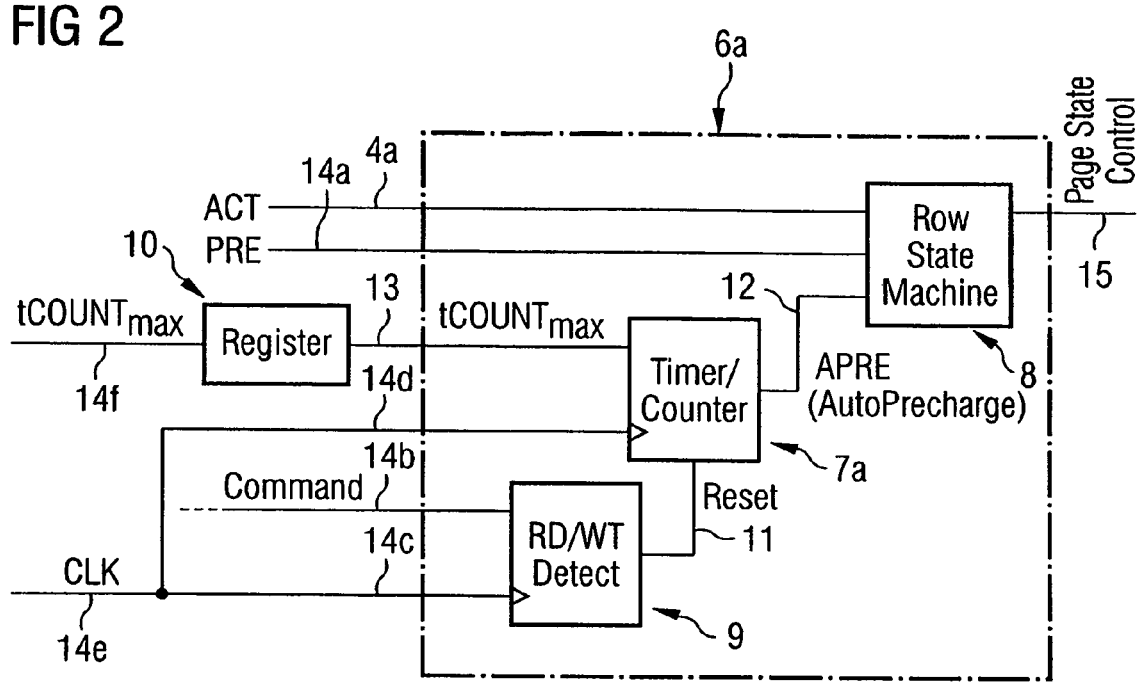
FIG. 2 shows a representation of the construction of a section of the semi-conductor memory components shown in FIG. 1.

As is further apparent from FIG. 2, the output connections of the timer and/or counter device 7a are connected via a line 12 to a row and/or word line state control device 8 (row state machine 8), which is additionally—correspondingly similar to conventional row and/or word line state control devices— connected via a line 14a, and the above line 4a to the memory component control device 5 (whereby the word line activation command signal (ACT signal) can be relayed with the help of line 14a from the memory component control device 5, and the above word line deactivation command signal (PRE command signal) with the help of line 4a to the row and/or word line state control device 8).

Figure 3:
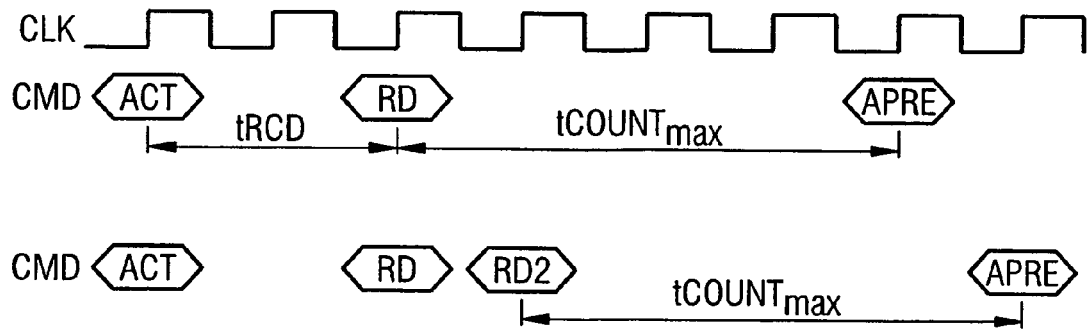
FIG. 3 shows a timing diagram of signals used in the control of a sub array shown in FIG. 1.

If a write or read access takes place at sub-array 3a—allocated to the sub-array control device 6a shown in FIG. 2—as illustrated in FIG. 3—a corresponding word line activation command signal (activate command (ACT)) signal is output by the memory component control device 5 and transferred—as per FIG. 2—to the row and/or word line state control device 8 of the sub-array 6a via line 4a.

The row and/or word line state control device 8 (correspondingly similar to a conventional row and/or word line state control device) then outputs a corresponding control signal (here: a page state signal) to a control line 15, which causes a corresponding row and/or word line—defined by the relevant row address—to be activated.

This has the effect that the data values stored in the memory cells laid down in the corresponding row—defined by the relevant row address—are read out by the read amplifier ("sense amplifier") allocated to the corresponding word line.

Next—as illustrated in FIG. 3—a read or write command signal (read (RD) and/or write (WT)) is relayed by the memory component control device 5 (via a corresponding line signal) to the sub-array control device 6a.

This does not occur—as also illustrated in FIG. 3—immediately after the word line activation command signal (activate command (ACT) signal) has been output, but only after a particular minimum time period and/or after a number of pulses (RAS-CAS delay time tRCD)) has been observed.

After receiving the read or write command signal (read (RD) and/or write (WT) command signal) the sub-array control device 6a—correspondingly similar to a conventional sub-array control device—causes the corresponding data—then accurately specified by the corresponding column address—to be correspondingly output (e.g. by the corresponding sense amplifier(s)) or to be read into the corresponding memory cell(s).

As already described above, whenever—again relating to FIG. 2—a read or write command signal (Read (RD) and/or Write (WT) command signal) is output by the memory component control device 5 for the relevant memory cell sub-array 3a, the corresponding signal is transferred—via the above line 14b—to the read/write command detection device 9 of the sub-array control device 6a.

When the read/write command detection device 9 establishes that the memory component control device 5 has output a valid read or write command signal (Read (RD) and/or Write (WT) command signal)—i.e. one present in stable form on the ascending flank of the pulse signal CLK—and transferred to the pulse input of the read/write command detection device 9 for the relevant memory cell sub-array 3a, the read/write command detection device 9 sends a resetting signal (RESET signal) via line 11 to the timer and/or counter device 7a (more accurately: to its resetting connections).

When the timer and/or counter device 7a receives the resetting (RESET) signal, the reading on the timer and/or counter device 7a is reset to "zero" (i.e. the timer and/or counter device is reset to a starting state and/or reading).

The timer and/or counter device 7a counts the number tCOUNT of pulses input at its counter connection (or more accurately the number of positive pulse flanks of the pulse signal CLK—input via the pulse line 14e and line 14d connected to it, at the counter connections of the timer and/or counter device 7a)—i.e. it measures the time tCOUNT elapsed since the last resetting of the timer and/or counter device 7a.

After the above read or write command signal (read (RD) and/or write (WT) command signal) has been sent to the sub-array control device 6a, the memory component control device 5 at first leaves the word line and/or row of the corresponding sub-array 3a—activated by the above ACT command signal—in the above activated state (i.e. it initially sends no corresponding word line deactivation command signal (pre-charge or PRE command signal) to the corresponding sub-array 3a (and/or its sub-array control device 6a)).

The timer and/or counter device 7a compares the reading tCOUNT—recorded since the last resetting of the timer and/or counter device 7a—(i.e. the time tCOUNT elapsed since the last resetting of the timer and/or counter device 7a), with a pre-determined critical limit or threshold $tCOUNT_{max}$—stored in register 10 and transferred via line 13 to the timer and/or counter device 7a.

The required value—or if applicable, the sub-array specific value—of $tCOUNT_{max}$ (i.e. a different value for each of the different sub-arrays 3a, 3b, 3c, 3d of the semi-conductor memory component 1, or one identical value for all the sub-arrays 3a, 3b, 3c, 3d) can be transferred by the memory component control device 5 ("memory controller") via a line 14f to each sub-array 3a, 3b, 3c, 3d (and/or to the corresponding sub-array control device 6a, 6b, 6c, 6d) to the register 10 allocated to it (and/or alternatively to a single register—jointly outputting the corresponding same critical limit or threshold $tCOUNT_{max}$ for the sub-arrays 3a, 3b, 3c, 3d of the semi-conductor memory component 1).

The relevant critical limit or threshold $tCOUNT_{max}$ can be constantly output in fixed form—depending on the memory component control device 5 ("memory controller") used in each case—or scanned (and if required, adapted) by the relevant memory component control device 5—before and/or while the semi-conductor memory component 1 is in operation—(i.e. the semi-conductor memory component 1 can in each case be optimally configured by the memory component control device 5—depending on the actually existing conditions).

For instance, the critical limit or threshold $tCOUNT_{max}$ that is applied can amount to between 2 and 10 pulses (or positive pulse flanks) counted, particularly for instance 3 to 8 pulses (pulse flanks) counted; in this embodiment example e.g. four pulses (pulse flanks).

The register 10 can be arranged on the semi-conductor memory component 1, e.g. adjacent to the relevant sub-array control device 6a, 6b, 6c, 6d (or it can be part of the sub-array control device 6a, 6b, 6c, 6d), and the relevant critical limit or threshold $tCOUNT_{max}$ can then—e.g. even before the semi-conductor memory component 1 assumes its (actual) operation—be transferred from the memory component control device 5 via line 14f to register 10.

When the timer and/or counter device 7a determines that the critical limit or threshold $tCOUNT_{max}$—the reading tCOUNT achieved since the last resetting of the timer and/or counter device 7a—(i.e. the time period tCOUNT that has elapsed since the last resetting of the timer and/or counter device 7a) has been reached (i.e. that no further read or write command signal (Read (RD) and/or Write (WT) command signal) has been received by the sub-array control device 6a from the memory component control device 5 during the pre-determined time period and/or number of pulses $tCOUNT_{max}$), a control signal (auto precharge or APRE signal) is sent—for instance as also illustrated in FIG. 3—by the timer and/or counter device 7a via line 12) to the rows and/or word line state control device 8.

The row and/or word line state control device 8 then prematurely causes the above row and/or word line—defined by the above row address—to be (prematurely) deactivated (and as is the case with a conventional row and/or word line state control device, once a corresponding PRE signal—transferred from the memory component control device 5 via line 14a—has been received) by outputting a corresponding control signal (page state control signal) on control line 15, and thereby the sub-array 3a to be prepared for the next word line activation command (activate command (ACT)).

If (which is statistically frequently the case, and which is further illustrated in FIG. 3 below), even before the timer and/or counter device 7a has established that the counter reading tCOUNT that has been attained since the last resetting of the timer and/or counter device 7a, (i.e. the time period tCOUNT that has elapsed since the last resetting of the timer and/or counter device 7a) has reached the critical limit or threshold $tCOUNT_{max}$ (i.e. even before the above control signal (Auto Precharge and/or APRE signal) is sent out by the timer and/or counter device 7a, 7b, 7c, 7d) and if a memory cell or cells (allocated to the same word line and/or row as that/those memory cell(s) at which the last accessing took place) is/are accessed at the corresponding sub-array 3a, 3b, 3c, 3d, a corresponding further read (or write) command (RD (or WT) command) is immediately output by the memory component control device 5 to the sub-array control device 6a of sub-array 3a (mentioned in FIG. 3 under "RD2")—without any prior corresponding PRE or ACT signal being output.

This has the effect that the corresponding data—accurately specified by the corresponding column address (e.g. by the corresponding sense amplifier(s)) is output immediately (or read into the corresponding memory cell(s) without a corresponding RAS-CAS delay taking place), and that—as illustrated above—the timer and/or counter device 7a is zeroed.

If—which is statistically more rarely the case—at sub-array 3a—instead of the above memory cell(s)—a memory cell or cells is/are accessed that has/have been allocated to another word line and/or row, than that/those memory cell(s), at which the last accessing took place (and even before the timer and/or counter device 7a has determined that the counter reading COUNT, achieved since the last resetting of the timer and/or counter device 7a (i.e. the time tCOUNT elapsed since the last resetting of the timer and/or counter device 7a) has attained the critical limit or threshold $tCOUNT_{max}$ (i.e. even before the timer and/or counter device 7a, 7b, 7c, 7d has output the control signal (Auto Precharge—and/or APRE signal)), a corresponding word line deactivation command signal (Precharge and/or PRE command signal) is output by the memory component control device 5 via line 14a to the row and/or word line state control device 8 of the sub-array control device 6a of sub-array 3a.

The row and/or word line state control device 8 then causes—by outputting a corresponding control signal (page state control signal) on control line 15—the above row and/or word line defined by the above row address to be deactivated again, and thereby the sub-array 3a to be prepared for the next word line activation command (activate command (ACT)).

If the row and/or word line has already been deactivated because the timer and/or counter device 7a has already determined that the counter reading tCOUNT achieved since the last resetting of the timer and/or counter device 7a (i.e. the time period tCOUNT that has elapsed since the last resetting of the timer and/or counter device 7a) has reached the critical limit or threshold $tCOUNT_{max}$ and the above control signal (auto precharge and/or APRE signal) has already been output by the timer and/or counter device 7a, 7b, 7c, 7d), the memory component control device 5 does not need to output a PRE signal on line 14a (instead of which the memory component control device 5 can then immediately transfer a corresponding word line activation command signal (ACT signal) via line 4a to the row and/or word line state control device 8, and thereby—immediately—activate the corresponding row and/or word line).

To enable the memory component control device 5 to determine without any additional communication with the sub-array control device 6a whether its timer and/or counter device 7a has already output the above APRE signal (and consequently that the memory component control device 5 does not need to output a PRE signal, but, instead can immediately output a new ACT signal), a timer and/or counter device, corresponding in function and/or construction to the timer and/or counter device 7a shown in FIG. 2, can be provided in the memory component control device 5, which also measures and/or counts the time period and/or number of pulses since the last read or write command signal (read (RD) and/or write (WT) command signal) had been output by the memory component control device 5 to the sub-array 3a.

If the detected time period and/or counter reading measured by this timer and/or counter device has achieved or exceeded the above threshold $tCOUNT_{max}$, no PRE signal needs to be output by the memory component control device 5 via line 14a to the sub-array control device 6a in case of a new access at the sub-array 3a (instead the activation of the corresponding row and/or word line of the sub-array 3a can then be ordered with the help of an ACT signal output via line 4a).

REFERENCE NUMBERS

1 Semi-conductor memory component
3a Memory cell matrix
3b Memory cell matrix
3c Memory cell matrix
3d Memory cell matrix
4 Control line data bus
4a Sub-array control line
4b Sub-array control line
4c Sub-array control line
4d Sub-array control line
5 Memory component control device
6a Sub-array control device
6b Sub-array control device
6c Sub-array control device
6d Sub-array control device
7a Timer and/or counter device
7b Timer and/or counter device
7c Timer and/or counter device
7d Timer and/or counter device
8 Row state control device
9 Read/write command detection device
10 Register
11 Line
12 Line
13 Line
14a Line
14b Line
14c Line
14d Line
14e Pulse line
14f Line
15 Control line

What is claimed is:

1. A process for operating a semi-conductor memory component, comprising:
   activating memory cells of a memory cell array, included in a first set of memory cells in a same row or column of the memory cell array, when at least one of the memory cells included in the first set requires access;

accessing a corresponding memory cell or memory cells;

deactivating the memory cells included in the first set of memory cells, when access to at least one further memory cell, not included in the first set of memory cells, occurs; and prematurely deactivating the memory cells included in the first set of memory cells when a pre-determined time or number of pulses after the at least one of the memory cells included in the first set of memory cells have last been accessed, and no further accessing of the at least one of the memory cells included in the first set of memory cells occurs within the predetermined time or number of pulses.

2. The process according to claim 1, wherein the semi-conductor memory component comprises a plurality of memory cell arrays.

3. The process according to claim 2, wherein the premature deactivation is decentrally controlled for each memory cell array by a decentralized control device allocated thereto.

4. The process according to claim 3, wherein the decentralized control device includes a timer and/or counter device.

5. The process according to claim 3, wherein the decentralized control device is arranged on the semi-conductor memory component and in proximity to or adjacent to the respective memory cell array.

6. The process according to claim 2, wherein the non-premature deactivation is centrally controlled for the plurality of memory cell arrays by a central control device centrally allocated to the several memory cell arrays.

7. The process according to claim 6, wherein the central control device is located separate from the semi-conductor memory component.

8. The process according to claim 6, wherein a data value determining the pre-determined time or number of pulses, after which the memory cells included in the first set of memory cells should be prematurely deactivated, is written into a register by the central control device.

9. The process according to claim 8, wherein the data value stored in the register is transferred to the decentralized control device and to a timer and/or counter device.

10. A semi-conductor memory component, comprising:
an array control device for activating memory cells included in a first set of memory cells of a corresponding memory cell array, where the memory cells are located in a same row or column of the memory cell array, in reaction to an activation signal being received from a central control device, and for deactivating the memory cells included in the first set of memory cells in reaction to a deactivation signal being received from the central control device, wherein
the array control device prematurely deactivates the memory cells included in the first set of memory cells, when a predetermined time period or number of pulses after at least one of the memory cells included in the first set of memory cells have last been accessed, and no further accessing of the at least one memory cells included in the first set of memory cells occurs within the predetermined time or number of pulses.

11. The semi-conductor memory component of claim 10, further comprising memory cells.

12. The semi-conductor memory component of claim 11, wherein the memory cells comprise DRAM memory cells.

13. The semi-conductor memory component of claim 11, wherein the memory cells comprise a word line.

14. The semi-conductor memory component of claim 11, wherein the activating memory cells comprises activating the word line.

15. A semiconductor device comprising:
a memory cell array;
a state machine coupled to the memory cell array, the state machine comprising,
an activation input,
a deactivation input, and
an automatic deactivation input, wherein the state machine activates the memory cell array when the activation input is asserted, and wherein the state machine deactivates the memory cell array when the deactivation or automatic deactivation input is asserted;
a timer comprising,
a reset input, wherein the time is reset when the reset input is asserted, and
a deactivation output signal coupled to the automatic deactivation input of the state machine, wherein the deactivation output signal is asserted a predetermined period of time after the timer is reset; and
a read/write detector comprising a command input and a reset output coupled to the reset input of the timer, wherein the reset output is asserted when the read/write detector detects a read command or a write command.

16. The semiconductor device of claim 15, wherein the memory cell array comprises a DRAM memory cell array.

17. The semiconductor device of claim 16, wherein the deactivation signal comprises a pre-charge command signal.

18. The semiconductor device of claim 15, wherein the state machine deactivates the memory cell array the predetermined period of time after the read/write detector receives a read or write command when no further read/or write command is detected within the predetermined period of time and when no deactivation command is asserted within the predetermined period of time.

19. The semiconductor device of claim 15, wherein the timer comprises a counter.

20. The semiconductor device of claim 18, wherein the time further comprises a maximum count input, and wherein the maximum count input corresponds to the predetermined time.

* * * * *